United States Patent
Bloomstein et al.

[11] Patent Number: 5,389,196
[45] Date of Patent: Feb. 14, 1995

[54] METHODS FOR FABRICATING THREE-DIMENSIONAL MICRO STRUCTURES

[75] Inventors: Theodore M. Bloomstein, Cambridge; Daniel Ehrlich, Lexington; Anita M. Flynn, Arlington, all of Mass.

[73] Assignee: Massachusetts Institute of Technology, Cambridge, Mass.

[21] Appl. No.: 828,247

[22] Filed: Jan. 30, 1992

[51] Int. Cl.⁶ .......................................... H01L 21/00
[52] U.S. Cl. .................................. 156/643; 156/635; 437/915
[58] Field of Search ............... 156/635, 643; 437/915

[56] References Cited

U.S. PATENT DOCUMENTS

| | | | |
|---|---|---|---|
| 4,331,504 | 5/1982 | Chuang et al. | 156/635 |
| 4,615,756 | 10/1986 | Tsujii et al. | 156/635 |
| 4,615,904 | 10/1986 | Ehrlich et al. | 427/38 |
| 4,622,095 | 11/1986 | Grobman et al. | 156/635 |
| 4,834,834 | 5/1989 | Ehrlich et al. | 156/635 |
| 4,929,402 | 5/1990 | Hull | 264/22 |
| 5,081,002 | 1/1992 | Ruberto et al. | 156/635 |
| 5,129,991 | 7/1992 | Gilton | 156/635 |
| 5,232,749 | 8/1993 | Gilton | 156/635 |

OTHER PUBLICATIONS

"Laser–Chemical Three-Dimensional Writing of Multimaterial Structures for Microelectromechanics;" Bloomstein et al.; Published in Proceedings for IEEE Micro Electro Mechanical Systems pp. 202–203; 1991.

"Laser Deposition and Etching on Three-Dimensional Microstructures;" Bloomstein et al.; Published in 1991 International Conf. on Solid-State Sensors and Actuators Digest of Technical Ppapers–pp. 508–511.

"Making a Model and Doing It Fast;" The New York Times, Sunday, Sep. 23, 1990; p. F9.

"Truly Three-Dimensional Structures Microfabricated by Laser Chemical Processing;" Westberg et al.; 91CH2817–May 1991 IEEE pp. 516–519.

"The Small Wonders of Microengineering;" Ivan Amato; Science, 26 Jul. 1991; pp. 387–388.

Primary Examiner—Asok Pal
Attorney, Agent, or Firm—Lahive & Cockfield

[57] ABSTRACT

A method for producing a three-dimensional object includes the steps of providing an interface plane within a chamber and generating a beam of radiant energy having varied levels of beam energy density. The beam is directed to selectively expose a pattern of address points on the interface plane to the beam of radiant energy for a limited duration. Conditions are established in the chamber to enable the beam to induce a microchemical reaction at the interface plane at a rate which serves to form a portion of the three-dimensional object. A significant feature of the invention is that the microchemical reaction is substantially binary with respect to the beam energy density. That is, the reaction is either substantially "on" or substantially "off."

33 Claims, 5 Drawing Sheets

METHODS FOR FABRICATING THREE-DIMENSIONAL MICRO STRUCTURES

This invention was made with government support under contract Number F19628-90-C-0002 awarded by the Air Force. The government has certain rights in the invention.

BACKGROUND OF THE INVENTION

The invention relates generally to the fabrication of three-dimensional microstructures. In particular, the invention concerns laser etching and deposition techniques for forming three-dimensional microstructures in a vapor medium.

Known techniques for fine-scale three-dimensional patterning insufficiently serve the emerging field of micromechanics. As the field continues to develop, optimized mechanical structures will be required which will increasingly depart from the nearly two-dimensional regime of integrated circuit technology. Such optimized structures will exploit the benefits of a third dimension to increase forces and strengths, thereby affording more functionality in mechanical systems. Presently, even well-engineered macroscopic mechanical systems are difficult to imagine without free use of the third dimension.

Several adaptions to lithography, such as the LIGA (from the German Lithographic Galvanformung Abformung) x-ray technique, extend two-dimensional structures into greater height and provide some access into the third dimension. Lithography is, however, substantially limited to these merely quasi three-dimensional structures. Many applications, though, require a more versatile three-dimensional patterning technology which is more precise than the milling, welding and fastening technologies of existing macroscopic mechanical construction methods. In addition, there is a great need for techniques to assemble and package micromechanical systems.

Laser direct write technology refers to the laser induced etching or deposition of lines of material in or on a substrate. It has been developed for the repair and trimming of microelectronics in primarily two-dimensional applications. The emphasis, however, has been processing of nearly planar surfaces at micrometer or submicrometer resolution in two dimensions. The technology has not been developed to address the requirements of three-dimensional micromachining.

Some of the requirements of three-dimensional micromachining include speed, edge acuity, and resolution in the third dimension (depth). Texture and finish are also important, as well as compatibility with the processes and materials of current silicon micromachining. Micrometer scale precision and freedom from process induced damage of important electronic or mechanical structures are essential features for technology directed to the fabrication and assembly of microelectromechanical systems.

It is an object of the invention, therefore, to provide a process for producing three-dimensional microstructures that enables high resolution and profile versatility in the third dimension.

It is another object of the invention to provide a process for producing three-dimensional microstructures which is suitable for semi conductor fabrication applications.

Still another object of the invention is to provide a system for producing three-dimensional microstructures.

Yet another object of the invention is to provide a class of three-dimensional microstructures.

SUMMARY OF THE INVENTION

These and other objects are achieved by the present invention which in one aspect features a method for producing a three-dimensional object. The method includes the steps of providing an interface plane within a chamber and generating a beam of radiant energy having varied levels of beam energy density. A pattern of address points on the interface plane is selectively exposed to the beam for a limited duration. The interface plane is typically provided by a surface of a substrate. A significant step of the invention involves the establishment of conditions in the chamber to enable the beam to induce a micro-chemical reaction at the interface plane at a rate which is substantially binary with respect to the beam energy density. The micro-chemical reaction serves to form a portion of the three-dimensional object.

The induced microchemical reaction is non-linear, or binary, in that it self-extinguishes once the radiation level drops below a prescribed level of intensity. The prescribed level of exposure varies with chamber pressure. Moreover, the reaction rate does not increase significantly when exposed to higher radiant energy levels above the prescribed intensity. Thus, the reaction is typically nearly entirely "off" or entirely "on" and at a constant rate. This is achieved using reactions which are intrinsically highly nonlinear in their dependence on beam flux to obtain a rapidly switching "off" to "on" transition at beam flux above a critical value. The "saturated," nearly constant, "on" state is typically achieved by adjusting the vapor conditions so that the reaction is in a transport-limited kinetic regime. As a result, the reaction zone becomes starved for reactant and the reaction rate saturates to a constant "on" value. This combination of conditions permits the beam to turn the chemical reaction "on" and "off" in a binary fashion at each three-dimensional pixel.

When not "off" due to insufficient intensity, the reaction rate can be accurately controlled and modulated by varying the vapor conditions since the reaction is in a transport-limited regime which is ballistic in nature. As the vapor pressure is adjusted higher, the reaction rate saturates to a constant "on" value due to diffusional transport limitations. This combination of conditions permits the beam to turn the chemical reaction "on" by a controlled amount or nearly entirely "off" at each three-dimensional pixel.

The microchemical reactions induced in the process of the invention can be either etching or deposition reactions. Moreover, the reactions can include thermal and/or photochemical mechanisms. In one embodiment of the invention, the microchemical reaction is an etching reaction, the thermal component of which results in a phase transition of a portion of the interface plane.

For example, for operations on silicon using a 488-nanometer (nm) wavelength argon-ion laser to generate a beam having a diameter greater than several micrometers, the useful switching threshold typically can be created at approximately 0.8 to 6 kilowatts per centimeter of beam diameter. Slightly higher values, i.e., one to eight kilowatts per centimeter, are necessary for beam diameters smaller than several micrometers.

An effective means for achieving nonlinearity of the microchemical reaction is to use the melting transition in the silicon substrate. Since melting is a phase transition, a nearly infinitely sharp switching from an "off" to "on" state can be achieved with increasing beam flux. With the 488 nm wavelength beam, switching occurs at approximately 5.5 kilowatts per centimeter for a one micrometer beam diameter and at approximately 3.9 kilowatts per centimeter for beam diameters greater than three micrometers. For this same example, the above-discussed transport-limited saturation can be achieved by using an efficient etching vapor such as chlorine at a pressure between 100 and 1000 Torr with a focal point dwell time of between 10 and 1000 microseconds. On the other hand, saturation for deposition of silicon from silane, can be achieved at 200–400 Torr silane pressure. The switching points on a silicon substrate for the silane reaction using 488-nm light are approximately eighty percent of the values noted to induce the melting transition.

In some embodiments, the method of the invention includes the step of critically focussing the beam of radiant energy to provide within the chamber a focal point of radiant energy above a prescribed intensity. The beam is critically focussed in that only a highly localized portion of the beam includes energy above the prescribed intensity. This is contrary to most focussed-beam processes in which a softly focussed beam with relatively consistent intensity throughout is preferred in order to increase depth of focus and process latitude.

In some embodiments of the invention, the beam of radiant energy is a continuous beam and the duration of exposure of the address points is controlled by scanning the beam. In other embodiments, the beam is pulsed and exposure of the address points is a function of pulse energy, pulse length, and the number of pulses. In both cases, exposure is sufficient to modify the layer in accordance with the binary, localized reaction.

For one micrometer diameter beam using green wavelength light on silicon substrates, good localization to several micrometers or less can be achieved scanning at rates from about one micrometer per second to three or more centimeters per second or greater. Preferred scanning rates are one to fifty centimeters per second. Through this technique, the portion of the interface plane experiencing the microchemical reaction is limited to the region within the focal point of the radiant energy. This feature of the invention enables higher resolution than has been achievable with known micromachining methods.

New interface planes can be selectively exposed to the focal point by adjusting the focal point perpendicularly relative to the initial interface plane. Successive interface planes can thus be exposed in a stepping fashion to develop a layered, three-dimensional object. During an etching process, the focal point is stepped into the substrate forming the interface plane. During a deposition process, the focal point is stepped to the top surface of successively formed layers of the object.

In still another embodiment, the invention features a system for producing a three-dimensional object including a chamber and power means for generating a beam of radiant energy having varying levels of beam energy density. The system further includes patterning means for selectively exposing a pattern of address points on an interface plane within the chamber to the beam of radiant energy. Control means are providing for establishing conditions in the chamber sufficient to induce a non-linear microchemical reaction at the interface plane to form a portion of the three-dimensional object.

In various other embodiments of this aspect of the invention, means are also provided for critically focussing the beam of radiant energy to provide within the chamber a focal point of radiant energy above a prescribed intensity. Means are also provided for adjusting the focal point perpendicularly relative to the interface plane to selectively expose a new interface plane to the focal point. The system is suitable for forming distinctly three-dimensional objects through both etching and deposition.

In still another aspect, the invention features products formed in accordance with various methods of the invention. The products include various classes of microfluidic devices and micro-optoelectronic devices.

These and other features of the invention will be more fully appreciated by reference to the following detailed description which is to be read in conjunction with the attached drawings.

DETAILED DESCRIPTION

As stated, one aspect of the invention features a micromachining method for making three-dimensional objects in a size regime one to two orders of magnitude smaller than that of conventional machine tools. That is, objects made according to this invention may range in size from ten cubic micrometers to ten cubic centimeters.

The method utilizes fast, laser activated microchemical reactions to provide levels of resolution and versatility in the formation of the object profile in the third dimension which have been heretofore unachievable.

The inventive concept involves the architecture of layers. By successively forming two-dimensional patterns of finite thickness, through either etching in a substrate or deposition, a three-dimensional structure is formed. The invention utilizes non-linear microchemical reactions initiated by a beam of radiant energy which varies in beam density level to confine the reaction zone thereby providing exceptionally high resolution in three dimensions.

Figure 1:
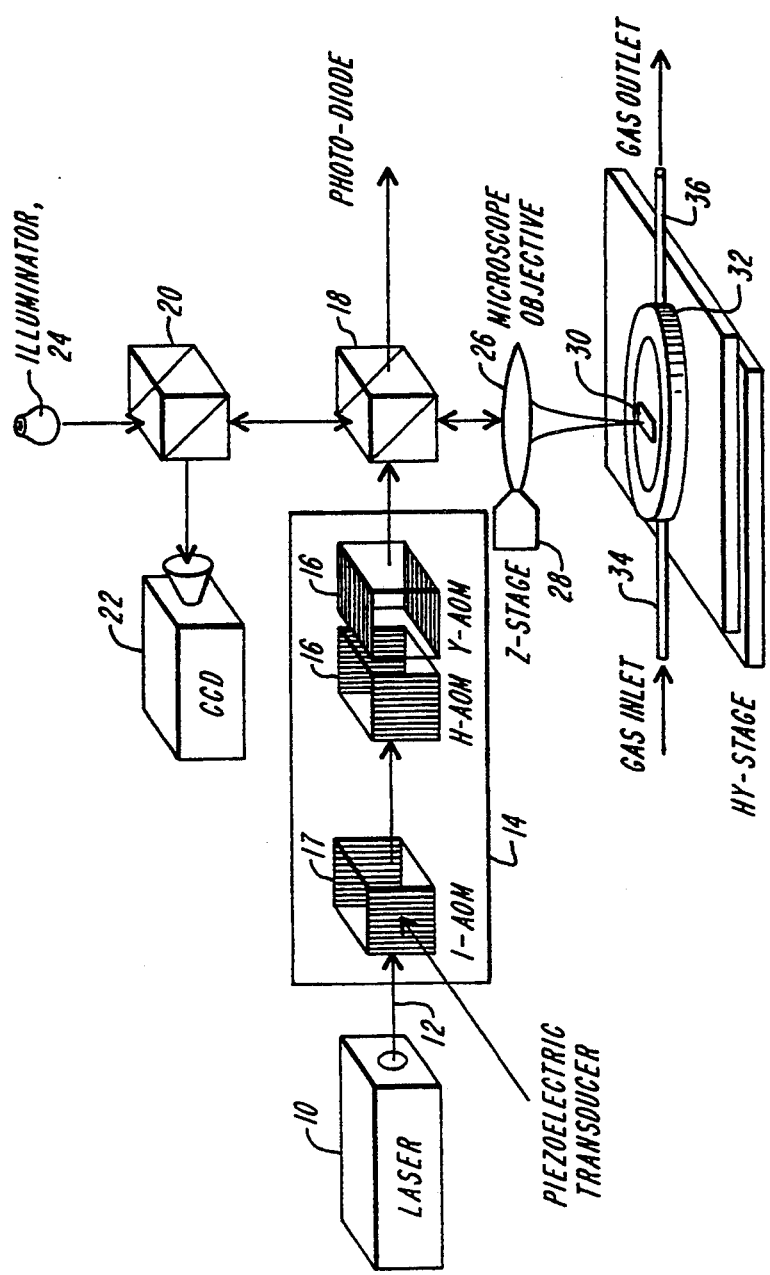
FIG. 1 is a schematic depiction of a vapor immersion three-dimensional micromachining system constructed in accordance with the present invention.

An illustrative system for carrying out the process of the invention is schematically shown in FIG. 1. There, a laser source 10 directs a beam of radiant energy 12 through an X-Y scanner 14. While a laser source 10 and laser beam 12 are shown and discussed below in detail, those skilled in the art will appreciate that the concepts of the invention are equally applicable to other types of energy beams such as, for example, electron and focused ion beams. Other beams will, of course, require other known scanning techniques. In the illustrated embodiment, the X-Y scanner includes a pair of $TeO_2$ driven acousto-optic deflectors 16 for addressing a field of 256×256 pixels. Other means for deflecting the beam 12 in the X-Y plane will be apparent to those skilled in the art. For example, a two axis galvo system can be used to scan a continuous-wave or pulsed laser. A third acousto-optic deflector 17 compensates in real time for the non-uniform transmission of the deflectors across the scan field. In random access mode, the 256×256 pixel field can be addressed at speeds up to 50,000 pixels per second. In raster mode the field can be addressed at up to 2.5 million pixels per second. This speed is limited, in the random access mode, by the acoustic wave stabilization time of approximately ten microseconds per address point.

From the X-Y scanner 14, the beam 12 travels to beam splitters 18 and 20. The beam splitters afford the ability to monitor the reaction zone and thereby provide feedback data. For example, as in the illustrated embodiment, a CCD camera 22 is utilized for monitoring the reaction zone and registering the scan to existing structure on the substrate. Further, an illuminator 24, such as a helium neon laser beam, introduced through beam splitter 20 into the focussing optics of the camera 22, can be detected in retroreflection and used to automatically maintain focus over extended X-Y travel by means of a spot minimization algorithm.

From beam splitter 18 the beam 12 travels to a microscope objective 26 which is fixed to a stage 28 ("Z-stage") for moving the microscope objective 26 in the Z direction. The microscope objective 26 critically focuses the beam to an interface plane 30 in a chamber 32. The Z stage is driven by a stepping motor (not shown) for displacing the microscope objective 26 to refocus the beam to successive interface planes for the successive patterning of layers. A suitable numerical aperture of the microscope objective is in the range of 0.1 to 0.9 and preferably is 0.25. This yields a nearly diffraction limited one micrometer focal spot.

Typically, a reactive vapor ambient is maintained in chamber 32 via gas inlet 34 and gas outlet 36. As discussed in greater detail herein below, the microchemical reaction conditions (chamber pressure, laser power, and scan rate) can be maintained to produce nominal one micrometer by one micrometer by one micrometer pixel address points. In some etching applications, however, a vacuum is maintained in the chamber 32.

Figure 2:
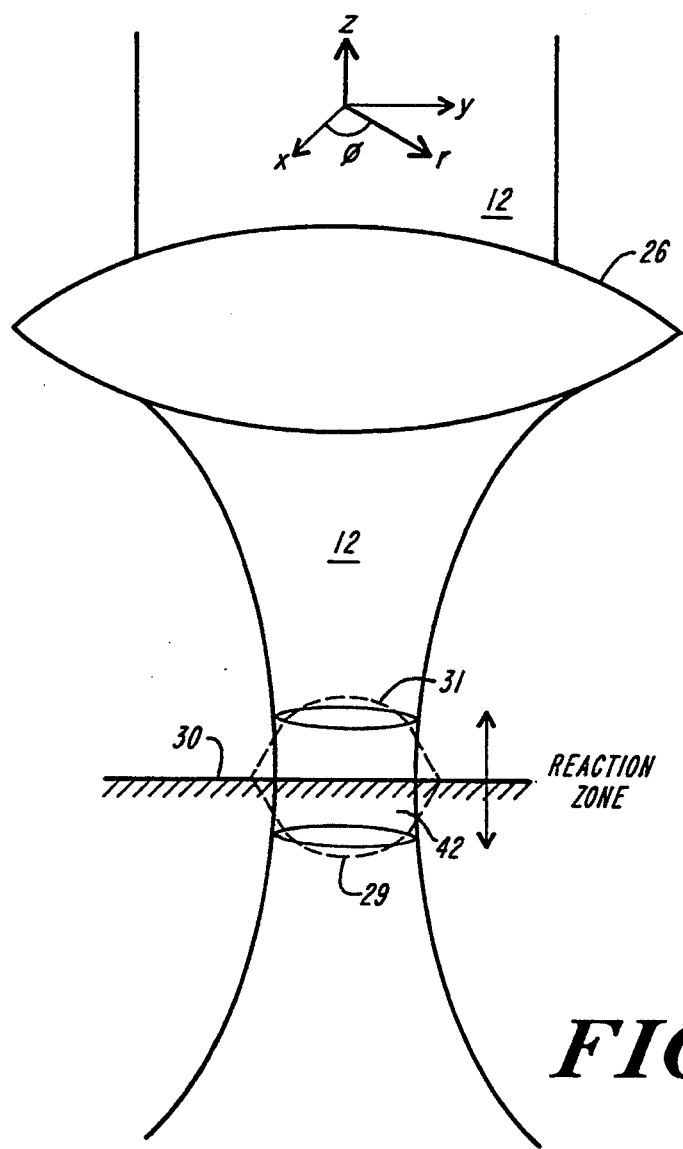
FIG. 2 is a schematic depiction of a microscope objective and beam focussing pattern in accordance with the invention.

The process of the invention is suitable for the formation of three-dimensional objects via both etching and deposition reactions. In some embodiments, an important feature of the invention is that a critically focussed beam of radiant energy induces a non-linear microchemical reaction. The microchemical reactions of the invention are non-linear, or binary, in that they essentially self-extinguish absent exposure to radiant energy above a prescribed intensity. In accordance with the invention, therefore, the beam 12 varies in beam density level so that it is only above the prescribed intensity at a certain points along the beam. The case of the beam being critically focussed is schematically represented in FIG. 2 which shows that after the beam 12 passes through the microscope objective 26 it is focussed down to a focal point 42 at the interface plane 30. Confining the radiant energy of the prescribed intensity to the focal point 42 restricts any microchemical reactions induced by that radiant energy to this zone. Accordingly, the focal point 42 can be referred to as a reaction zone.

As shown in FIG. 2, therefore, in the case of a deposition reaction, once material has deposited on the interface plane 30 to the extent of dashed line 31, the microchemical reaction self-extinguishes since the focal point 42 is no longer focussed at what has become the new interface plane 31. Similarly, in the case of an etching reaction, the reaction will self-extinguish when material has been removed to the extent of line 29 due to the position of what has become the new interface plane 29 in respect to the focal point 42. The focal point must be scanned in the X-Y plane and stepped in the Z direction to continue to form the object. This is described below in greater detail.

Similarly the reaction is confined along the substrate since it self-extinguishes abruptly at a distance where the beam-induced temperature of the substrate falls below the critical value. The substrate may be tilted relative to the Z-axis, but regions where the beam-induced temperature falls below the critical value will not be modified. The height of each pixel is accurately controlled by this effect and by accurately timing the beam dwell. The binary characteristic of the reaction is useful for this means of controlling height since the saturation means that an accurate height is achieved across the pixel and also that focal point dwell time is directly proportional to pixel height.

Figure 3:
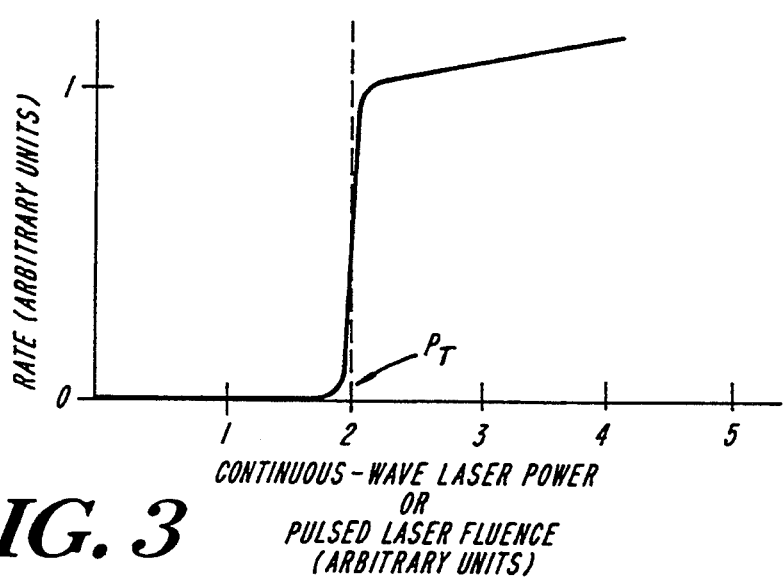
FIG. 3 shows the theoretical characteristic of a substantially binary reaction induced in accordance with the present invention.

FIG. 3 shows the theoretical characteristic of a substantially binary reaction where the rate of deposition or etching substantially self extinguishes below a prescribed beam power, for a continuous wave beam, or beam fluence, for a pulsed beam. In the Figure, that prescribed level is indicated as Pt. The reaction saturates to a nearly constant rate at higher powers. Ideally, the range of nearly-constant rate should be over a parameter window which is easily controlled by the laser apparatus so that even when fluctuations in the source or optical apparatus are present, the nominal laser intensity can be set so that the reaction can be considered either substantially fully "on" or substantially fully "off."

Figure 4:
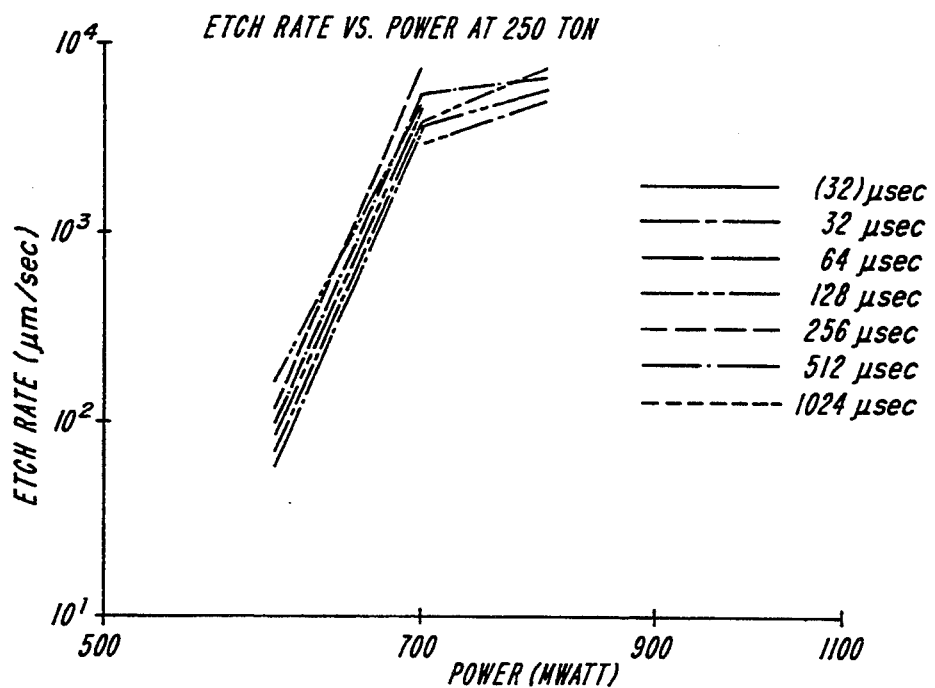
FIG. 4 shows an example of behavior of a substantially binary silicon etching reaction in accordance with the present invention.

FIG. 4 shows typical behavior of a well-constructed substantially binary chemical reaction for the specific case of silicon etching with 488-nm light in a 250 Torr chlorine atmosphere. The vertical axis shows the measured etch rate plotted for various dwell times ranging from 32 to 1028 microseconds. The horizontal axis is laser power. Note that the reaction rate rises rapidly from an immeasurable value (less than $2 \times 10^2$ micrometers per second) to greater than $3 \times 10^3$ micrometers per second with an increase in laser power from approximately 600 milliwatts to 700 milliwatts. The reaction rate then varies only slightly at laser powers greater than 800 milliwatts.

A useful etchant gas for silicon patterning is undiluted chlorine at a pressure of 1 to 2000 Torr. Other halogen-containing vapors, including $SF_6$, $CF_4$, $CCl_4$, and various freons are also useful. Preferred pressure conditions typically range between 10 and 2000 Torr. In addition to being useful silicon etchants, these gases are effective etchants for germanium, molybdenum, tungsten and other metals. For etching or some materials, e.g., aluminum and titanium, a diluent can be added to the etchant gas to moderate etching in the halogen component. For example, for aluminum and titanium etching, a 0.01 Torr to 100 Torr oxygen gas diluent stabilizes the laser etching, although it also slows the etch rate. In the etching of gold or tungsten, a wavelength shorter than approximately 500 nanometers will often be more effective since these metals become more strongly absorbent at these shorter wavelengths.

Deposition can be achieved using the nearly binary pyrolysis reaction for silane. Typical parameters for good deposition of polysilicon structures are approximately 200 Torr of undiluted silane, using a power per unit beam diameter of one to five kilowatts per centimeter at 488-nanometer wavelength on a silicon substrate. Chromium oxide structures can be deposited at 0.1 to two kilowatts per centimeter power on the same silicon substrate material using between one and ten Torr of chromium oxychloride as a vapor precursor.

By way of illustration, the process of etching a pattern into a silicon substrate such as silicon body 40 shown in FIGS. 5A–5C, will now be described in detail. The substrate is placed in the chamber 32 while a slowly flowing (one standard cubic centimeter per minute) ambient of chlorine gas is passed through the chamber which is maintained at approximately 100 Torr. The laser source 10, for example, a CW argon-ion laser, operates at 488 nanometers to deliver 900 milliwatts of power. A focal point of approximately one micrometer in depth and diameter is scanned across the surface of the substrate at approximately 7500 micrometers per second. This results in a dwell time of approximately 133 microseconds per pixel.

The radiant energy raises the temperature of each one micrometer cubic pixel of silicon to just above its melting point. Under the above-stated conditions, this occurs at an instant power per unit beam radius slightly exceeding $5 \times 10^3$ watts per centimeter. A quasi-equilibrium thermal profile accrues in the solid exposed to the focal point 42 in a time scale less than a microsecond. Moreover, the locally effected region is well confined to the area of the silicon near the one micrometer diameter radiated zone by the rapidly diverging steady state heat flow into the semi-infinite solid. Scanning speed is maintained fast enough to modify the layer in accordance with the non-linear localized reaction.

Figure 6:
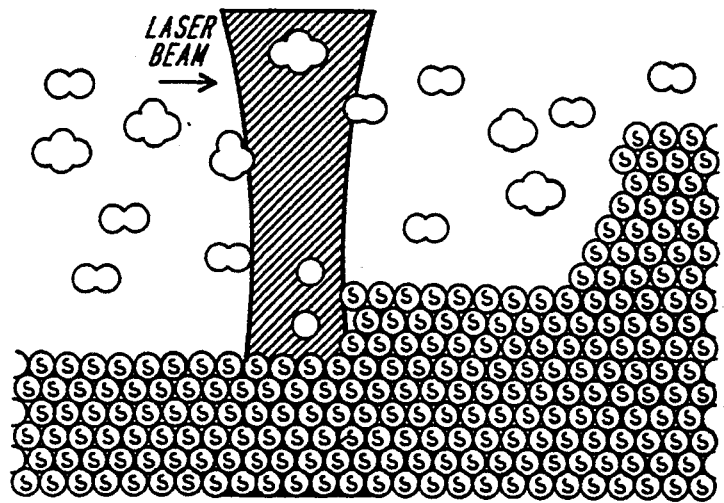
FIG. 6 is a schematic representation of an illustrative microchemical reaction induced in accordance with the invention.

As schematically represented in FIG. 6, the surface of the molten zone reacts with the chlorine ambient at a rate within an order of magnitude of the chlorine surface collision frequency. This is believed to be among the fastest known sustained gas/surface interfacial chemical reactions because of the extreme efficiency of the chemical path, the small zone size, and the reduction of transport limitations from boundary layer accumulation. The initial vapor phase product is believed to predominantly comprise $SiCl_2$. This product is eventually converted to $SiCl_4$ in the cooling vapor stream flowing out of gas outlet 36. When the beam 12 is scanned to the next address point, the thin unreacted liquid silicon layer epitaxially regrows to the single crystal substrate.

Figure 5A:
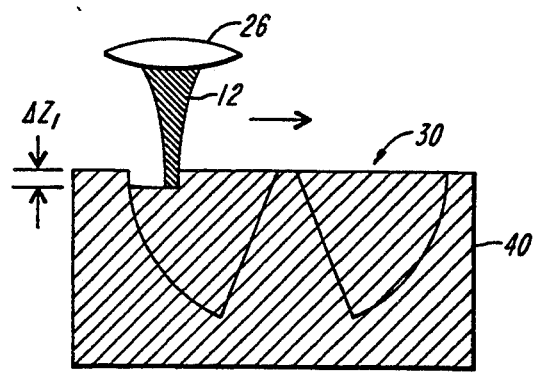
FIGS. 5A–5C are schematic depictions of an illustrative etching of a three-dimensional object in accordance with the invention.
Figure 5B:
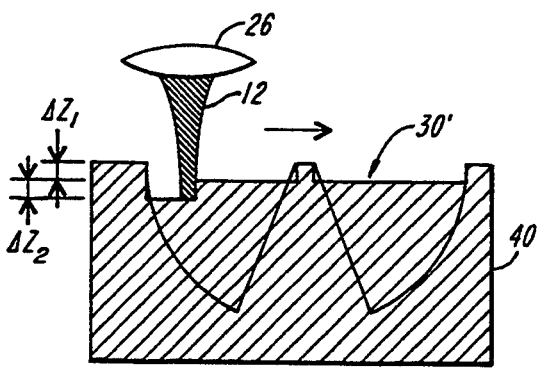
Figure 5C:
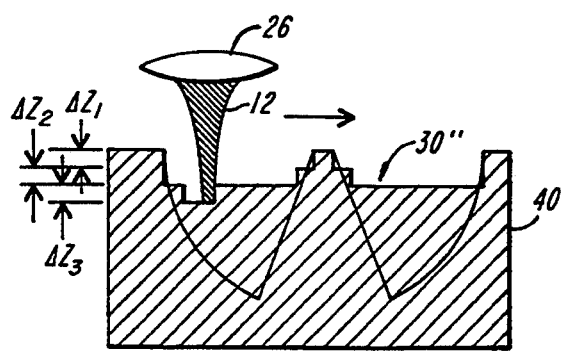

As stated, and as schematically represented in FIGS. 5A–5C, the invention provides for the formation of three-dimensional objects through the architecture of individual layers. As shown in FIG. 5A, a first layer $\Delta Z_1$ can be created by etching, for example, by way of the above-described microchemical reaction. This is achieved by positioning microscope objective 26 to focus focal point 42 of beam 12 at the interface plane 30, which in this case is defined by the upper surface of silicon body 40. The beam 12 is scanned to the right in the Figure to etch a pattern in the X-Y plane of the body having a a depth corresponding to the thickness of layer $\Delta Z_1$. Typically, that thickness is approximately one micrometer.

As shown in FIG. 5B, after the layer $\Delta Z_1$ is etched, a new interface plane 30' is exposed. The microscope objective 26 is then stepped down by way of Z stage 28 to focus focal point 42 on the new interface plane 30'. This results in a second layer $\Delta Z_2$ being etched. Again, after the beam 12 has scanned its X-Y pattern in the plane of layer $\Delta Z_2$, a new interface plane 30" is exposed. As shown in FIG. 5C, the microscope objective is again stepped via Z stage 28 for etching a layer $\Delta Z_3$ in silicon body 40.

It is a significant feature of the invention that material removal volumes can be so small at each address point that stepping increments can create essentially curved surfaces. This is an advantage over, for example, mask-based lithographic processes in which only flat surfaces can be formed.

Material removal rates of approximately $2 \times 10^4$ cubic micrometers per second have been achieved with the above described silicon chlorine system utilizing a 900 milliwatt laser power in conjunction with one micrometer focal point size, while maintaining a vapor atmosphere of approximately 400 Torr. This removal rate is nearly time independent and only weakly dependent upon scanning speed and laser power. Changing the laser dwell time at each pixel (ranging from 10 microseconds to 300 microseconds) alters the etched depth in a nearly linear fashion and can thereby be exploited to accurately control depth. Moreover, a larger dynamic range in etch rate can be obtained by altering the pressure in the chamber. For example, for applications requiring high depth precision, such as in the formation of curved surfaces, a laser dwell time of as small as one microsecond can be utilized to provide a material removal rate as small as $2 \times 10^{-2}$ micrometer depth per dwell.

In order to achieve the highest material removal rate possible, a high chamber pressure can be coupled with the largest focal point diameter which is consistent with the required degree of resolution and available beam power. For example, volumetric etching rates of greater than $2 \times 10^5$ cubic micrometers per second can be achieved using a ten micrometer focal point size and a 300 Torr chamber pressure.

The invention provides at least two distinct advantages over known methods for micromachining. These advantages include significantly greater resolution than has been heretofore achievable, and the ability to vary the profile of an object in the third dimension. In the case of etching in silicon, the X-Y resolution of the process depends on the confinement of the molten silicon zone. Because of the non-linearity of the phase transition and the efficient heat spreading into the solid, this zone can be significantly smaller than the diffraction-limited beam diameter. For example, using a visible light beam with 0.5 numerical aperture focussing optics in cooperation with thermal chlorine reactions, 0.2 micrometer line widths in silicon have been achieved. Vertical resolution (in the Z direction) is controlled by timing the duration of the melt and, if necessary, by slowing the reaction through reduced chamber pressure. For example, at 1 Torr chamber pressure, the etch depth becomes 1 nanometer per 10 microsecond temporal resolution element. Modifying the laser beam intensity distribution using beam-shaping optics can be used to create "laser tool-bits" which can be used to control the reaction profile by changing the thermal patterns in the work-piece.

While some material changes are expected in the submicrometer thick epitaxially regrown silicon layer, the thin layer of regrown silicon is comparable in quality to that resulting from laser annealing. In most cases, this is quite sufficient for the formation of high performance electronic devices.

Polishing of structures can be accomplished by reducing the laser power below the melt threshold and making use of the photochemical reaction driven by vapor phase laser photolysis of the atmosphere in the chamber. In the case of a silicon substrate in a chlorine atmosphere, the photolysis reaction produces a plume of chlorine atoms which is reactive well below the silicon melting point. For example, at a wavelength of 488 nm, nearly one percent of the chlorine gas can be photochemically activated at approximately 50 Torr $Cl_2$ pressure. While this photochemical mechanism is typically three to four orders of magnitude slower than the thermal process, its low temperature and slow rate make it attractive as a method for polishing structures which have been thermally laser-etched.

Another patterning strategy is to use a pulsed laser in either a scanned focused or field-imaged mode. Pixel height can then be controlled by the non-linear, binary, reaction as discussed above and the timed exposure supplied by the duration of the laser pulse. For example, a 308 nm wavelength laser using a 20-nanosecond pulse duration can be used to induce a solid-to-vapor phase transition of polyimide in an air or vacuum ambient and thereby etch 0.1 to 1 micrometer deep pixels with each pulse. The reaction is of the phase transition solid-to-vapor type with a concomittant chemical degradation of the polyimide. Moreover, the pulse repetition rate can be varied from 1 to 400 pulses per second to control material removal rate. The required fluence for this reaction is typically 50 to 400 millijoules per square centimeters. Preferred conditions for patterning polyimide are 150 millijoules per square centimeter at 308 nm wavelength. Under these conditions, approximately 0.2 micrometer depth of material is removed with each laser pulse in either ambient case. Vacuum irradiation, however, results in cleaner etching.

Figure 7:
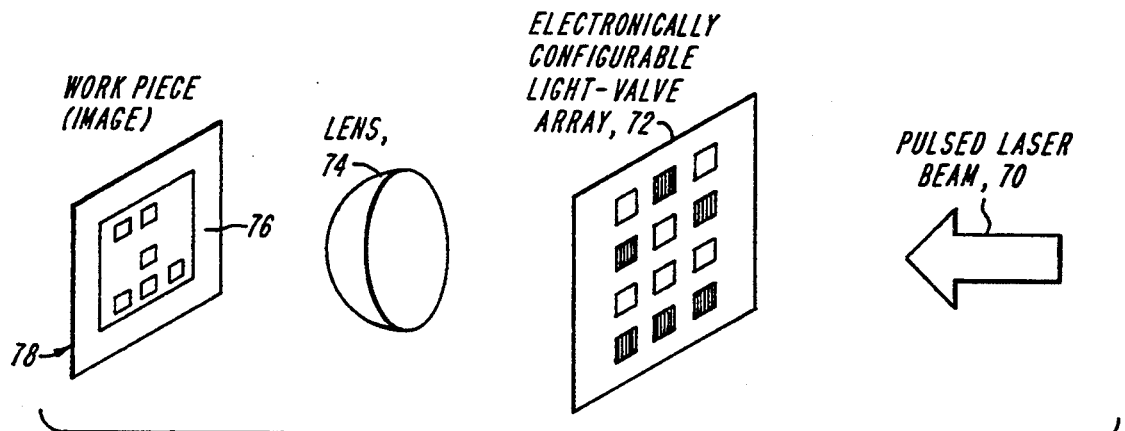
FIG. 7 is a schematic representation of a field-imaging system suitable for use with the invention.

A field-imaged mode system is schematically shown in FIG. 7 wherein a light-valve array device 70 is illuminated with a pulsed laser beam 72 and images the beam 72 to a lens 74 for focussing onto an interface plane 76 on a workpiece 78. Either a reflection or transmission light valve array can be used, provided a fluence above the critical value for the non-linear reaction is achieved. The light-valve device 70 is reconfigured in time without scanning the work piece. Those skilled in the art will be familiar with reflective and transmissive light valve devices. After the desired depth for the pixel is achieved by counting pulses (usually 1–20 pulses) the light-valve array 70 is electronically reconfigured in a known manner and the work piece 78 is stepped in the Z direction either toward or away from the lens 74. Irradiation of the next plane of pixels is then begun. After the full three-dimensional structure is achieved, the workpiece is stepped to the next field site and the process is repeated.

Etching of polyimide provides an excellent example for patterning with a UV laser in the field-imaged mode. However, it will be obvious to those skilled in the art that numerous organic and inorganic materials may also be etched including metal-oxide ceramics and metals. Short pulses, 30 nanoseconds or less, are preferred for most materials since non-linear reaction conditions are achieved more easily. The field-imaged mode can also be adapted for deposition. In this case the nonlinear reaction is used to deposit a pattern of material from a gas phase precursor. For example, silicon can be deposited from disilane using a 193 nm laser. For most silicon or ceramic substrates the disilane pressure will preferably range from approximately 10 Torr to approximately 100 Torr and the incident laser fluence will range from 50 to 500 millijoules per square centimeter. In etching or deposition an effective mode of operation is to use a 128 pixel by 128 pixel light valve array with reflective sixty micrometer by sixty micrometer pixels. The array is imaged onto the work piece at a five times reduction factor so that a field of 16,384 squares, each twelve micrometers across, can be etched or deposited. For etching of polyimide using 193 nanometer pulses of approximately 20 nanoseconds duration, the imaging lens may be an all-reflective optic if necessary for UV wavelengths less than approximately 250 nanometers. Fluence at the light valve array is preferably adjusted to be approximately equal to 4RE millijoules per square centimeter where R is the light valve reflectively and E is the imaging-system efficiency. To etch five micrometers deep, the laser is fired at a repetition frequency of 200 hertz for approximately 0.25 second. The light valve array is then electronically reconfigured in a switching time less than 0.1 second and the laser is again fired to etch the next layer pattern. Numerous laser deposition and etching processes can be implemented, many of which are described in the book "Laser Microfabrication: Thin Film Processes and Lithography, Edition by D. J. Ehrlich and J. Y. Tsao (Academic Press, Boston, 1989).

The processes and system of the invention are suitable for the formation of a wide array of microelectromechanical devices. Previous to this invention this class of devices has been impractical because of the difficulty of making microscopic three-dimensional surfaces. In particular it has been impractical to make three-dimensional smooth curves of prescribed shape which are essential for well-designed flow devices. It has furthermore been impossible to design and implement microchannel structures at fine dimension directly from a computer-aided-design file without the significant time delays characteristic of microfabrication using conventional photomasks. In contrast, with the invention the design and fabrication of complicated devices can be carried out in minutes or hours. This is critical in commercial applications in which great value is placed on the speed with which a custom device can be delivered to the marketplace.

In a typical example of automated design and fabrication of a custom device in accordance with the invention, a microfluidic "standard cell" class of devices analogous to semiconductor electronic circuits can be developed and stored in a computer file. The "standard cells" can be three-dimensional microstructures such as flow channels, branches, valve seats, pump seats, and detector elements. A designer can then recall these "standard cells" and assemble them at a computer-aided-design terminal into a custom fluidic system. Data from the terminal can then be sent directly to a laser scanner or light valve array thereby allowing a prototype device to be etched or deposited in minutes. Multiple copies of the device can be manufactured by making molds in this fashion and by then stamping out multiple copies using known replication techniques.

A broad class of integrated microfluidic circuits can be developed around the construct of functional layers in this manner. These circuits include devices such as valves, pumps, plumbing manifolds, chemical sensors, physical sensors (such as pressure and temperature) and heat exchangers. In addition, thermal isolation structures integrated into the native silicon water with electronics may allow more flexibility in dissipating heat. The devices are miniaturized and interconnected at high density in order to gain the advantages of high complexity, small fluid volume, high sampling speed, reliability, and low fabrication costs. They are extremely well suited for the processing of precious fluids. Moreover, their small size lends itself to low material costs, ease of implantability and portability. Such microfluidic systems can be utilized for high speed chemical analysis using expensive reagents or pharmaceuticals, the synthesis of macromolecules by high speed switching of flows, the detection of nerve or chemical warfare agents, the detection of drugs, and as physiological monitors. Additionally, the systems can be utilized in forensic, chemical and genetic engineering applications for the sequencing of genetic material. Macroscopic dimensioned fluid systems are impractical for applications such as these for various reasons including the cost of reagent fluids and the cost of constructing highly branched macrofluidic system.

Figure 8:
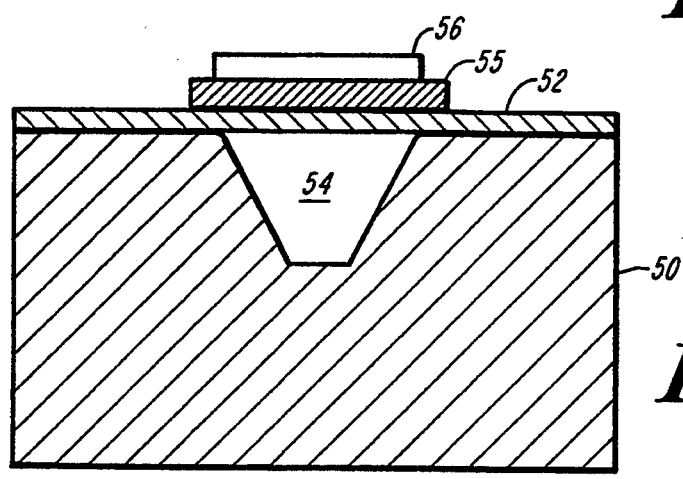
FIG. 8 is a schematic depiction of a microfluidic circuit constructed in accordance with the invention.

As discussed in detail above, such microfluidic systems can be formed through the architecture of layers. Again, silicon is an excellent choice of base material. An important property of the silicon/chlorine reaction is its Si/SiO$_2$ material selectivity of greater than 1000:1. This is inverted relative to the Si/SiO$_2$ <<1 selectivity used in more conventional sacrificial-layer processing of micromechanical devices. By exploiting this property, buried subsurface channels can be created in silicon beneath a surface oxide to create fluid and vapor flow channels. FIG. 8 schematically shows a cleaved silicon wafer 50 with a layer of thermal oxide 52. The above discussed microchemical reactions are induced by scanning the laser focal point under the transparent oxide film 52 to create a flow channel 54 beneath the oxide layer 52. The developing channel 54 allows flow of vapor phase reactants and products in and out of the reaction zone to sustain the reaction.

An electronic device layer, such as a thin film piezoelectric layer 55 and metallization film 56, may be added to provide, for example, an actuator layer for the valve and pumps formed in the substrate by the above described laser techniques. Other activator layers could use lead-lanthanum-zirconium-titanium (PLZT), zinc oxide or other electro-mechanical thin films. Alternatively, electronics can be formed on a separate chip and connected to the microchip by hybrid or multi-chip module technology. They can be either fabricated on a separate substrate and bonded or laminated to a first substrate containing the passive structures. A good choice of the actuator film is sol-gel deposited lead zirconium titanate. The electrode layer 56, can be platinum.

Figure 9A:
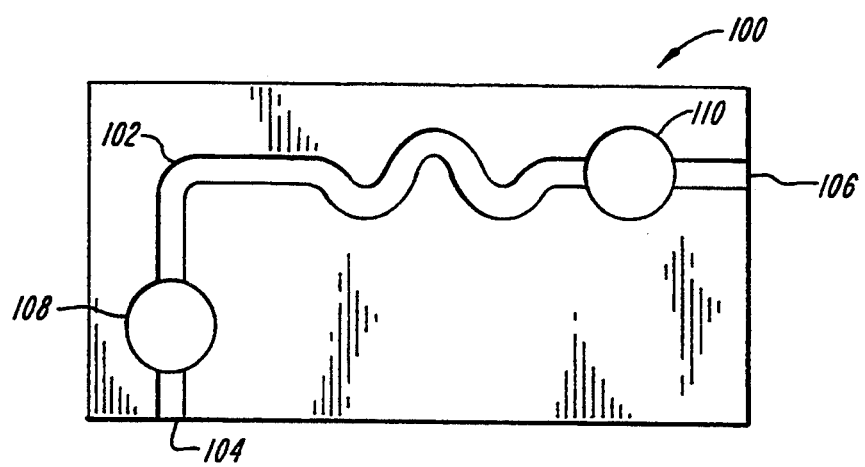
FIG. 9A is a schematic plan view of a microfluidic circuit constructed in accordance with the invention.

So, for example, FIG. 9A shows a plan view of a typical microfluidic standard cell 100 that can be fabricated by the above-described techniques. The cell 100 includes a flow path 102 have inlet port 104 and outlet port 106. Additionally, a pump 108 and a valve 110 control flow through the flow path 102.

Figure 9B:
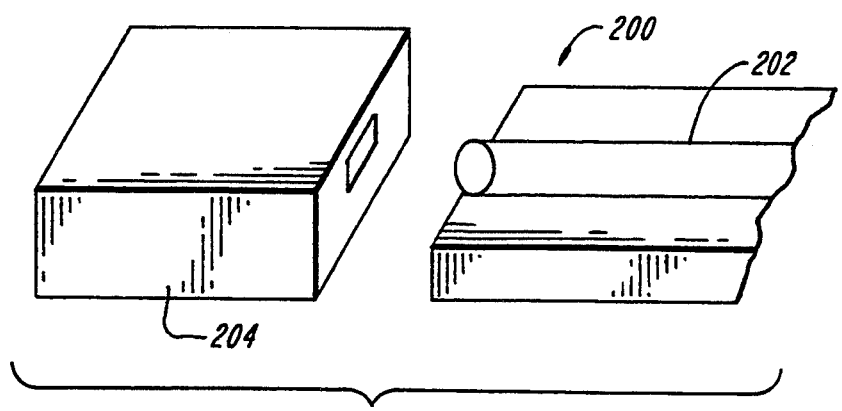
FIG. 9B is a perspective schematic view of a fiber-optic cable coupling device constructed in accordance with the invention.

Another example of a device that can be assembled or optimized in accordance with the above-described techniques are various miniaturized integrated optical systems such as the fiber optic coupling 200 shown in FIG. 9B. The coupling 200 is a precision mechanical structure for aligning a fiber optic cable 202 with a laser 204. Other micro-optic applications include the precision machining of various types of refractive and diffractive optics. Also, laser deposition using the processes cited can be used to attach devices, to optimize optoelectronic components, and to customize performance. Laser three-dimensional etching can be used for the fabrication of wells, mirrors, and other optoelectronic structures, and to adjust the dimensions of partially fabricated systems.

A further class of applications for the invention is the assembly and packaging of microdevices. Previously, there have been limited techniques for microscopic operations akin to, for example, welding at macroscopic dimension. By means of the invention it is possible to assemble and repair three-dimensional parts at microscopic scales. For example, a microscopic cotter pin can be created by depositing from silane gas a twenty micrometer silicon ball on the end of a ten micrometer bearing post to fix a one-hundred micrometer, or smaller, gear on an end of the post. Similarly, using laser deposition from a silane/ammonia gas mixture, a three-dimensional silicon nitride wear pad could be created on this structure as well.

In embodiments of the system of the invention utilizing a polygon scanner for horizontal directed scanning and a galvonometer for vertical scanning, the system can be utilized for in etching vias through a silicon wafer to allow subsequent passivation and metallization for through wafer contacts. This is because these scanning mechanisms retain the high beam energy required for this type of operation. Potential applications for this process include isolation of one side of a circuit from a harmful environment such as the type to which various micro-chemical sensors might be exposed. For example, the sensing agent may be on one side of a wafer while the electronics is on the other side.

While various embodiments of the invention have been described in detail, it will be appreciated by those skilled in the art that variations to those embodiments can be made without departing from the spirit and scope of the invention. The invention is to be defined, therefore, not by the preceding detailed description but by the claims that follow.

What is claimed is:

1. A method of producing a three-dimensional object, comprising providing a substrate having an outer surface defining a first interface plane having selected dimensions, the interface plane having a series of address points contained within said selected dimensions, generating a beam of focused radiant energy that is incident upon at least one selected address point in said plane, etching a selected number of the address points to a selected depth by a photochemical reaction induced by the focused radiant energy, defining at least a second interface plane having selected dimensions disposed below the first interface plane and within the substrate, and etching a selected number of the address points contained within the second interface plane to a selected depth by the photo-chemical reaction, whereby the successive etching of selected address points within the first and second interface planes forms the three-dimensional object in the substrate.

2. The method of claim 1 further comprising critically focusing said beam of radiant energy to provide a focal point of radiant energy above a prescribed intensity level.

3. The method of claim 2 further comprising adjusting the focal point of said beam perpendicularly relative to said first interface plane to selectively expose said address points of said second interface plane to said focal point.

4. The method of claim 2 wherein said focal point has a depth in a direction perpendicular to the interface plane between about 1 $\mu$m and about 20 $\mu$m.

5. The method of claim 1 further comprising
providing a chamber which houses the substrate, and
establishing conditions in the chamber to enable the beam of focused radiant energy to establish the photo-chemical reaction.

6. The method of claim 1 wherein the photo-chemical reaction results in a phase transition of at least a portion of the interface plane.

7. The method of claim 1 wherein the photo-chemical reaction is a non-linear reaction, such that the reaction self-extinguishes absent exposure to radiant energy above a prescribed intensity.

8. The method of claim 1 further comprising exposing a selected number of said address points to said beam of focused radiant energy for a selected dwell time.

9. The method of claim 8 wherein said dwell time is between about 1 $\mu$s and about 300 $\mu$s.

10. The method of claim 8 wherein said dwell time is determined by scanning said beam between selected address points.

11. The method of claim 1 further comprising precisely controlling said successive etching of said interface planes in a plane perpendicular to said interface plane.

12. The method of claim 1 wherein said substrate is composed at least in part of a material selected from the group consisting of silicon, germanium, and gallium arsenide.

13. The method of claim 1 wherein said substrate is composed of a material selected from the group consisting of aluminum, titanium, molybdenum, and tungsten.

14. The method of claim 1 wherein said substrate is composed of a material selected from the group consisting of ceramic materials and polyimides.

15. The method of claim 5 wherein said step of establishing conditions in said chamber includes the maintenance of an atmospheric pressure within said chamber in the range between about 0.1 Torr and about 2000 Torr.

16. The method of claim 15 wherein said atmosphere comprises a halogen-containing vapor.

17. A method of producing a three-dimensional object, comprising
providing a substrate having an outer surface defining a first interface plane having selected dimensions, the interface plane having a series of address points contained within said selected dimensions, generating a beam of focused radiant energy that is incident upon at least one selected address point in said plane, depositing a selected material at a selected number of the address points to a selected height by a photochemical reaction induced by the focused radiant energy, defining at least a second interface plane having selected dimensions disposed above said first interface plane and above said substrate, said dimensions including a series of address points, and etching a selected number of said address points contained within the second interface plane to a selected height by the photo-chemical reaction, whereby the successive depositing of material at selected address points at said first and second interface planes forms said three-dimensional object on said substrate.

18. The method of claim 17 further comprising critically focusing said beam of radiant energy to provide a focal point of radiant energy above a prescribed intensity level.

19. The method of claim 18 further comprising adjusting the focal point of said beam perpendicularly relative to said first interface plane to selectively expose said address points of said second interface plane to said focal point.

20. The method of claim 17 further comprising
providing a chamber which houses the substrate, and
establishing conditions in the chamber to enable the beam of focused radiant energy to establish the photo-chemical reaction.

21. The method of claim 17 wherein said photochemical reaction results in a phase transition of at least a portion of said interface plane.

22. The method of claim 17 wherein said photochemical reaction is a non-linear reaction, such that the reaction self-extinguishes absent exposure to radiant energy above a prescribed intensity.

23. The method of claim 17 further comprising exposing a selected number of said address points to said beam of focused radiant energy for a selected dwell time.

24. The method of claim 23 wherein said dwell time is between about 1 $\mu$s and about 300 $\mu$s.

25. The method of claim 23 wherein said dwell time is determined by scanning said beam between selected address points.

26. The method of claim 1 further comprising precisely controlling said successive depositing of said material upon said interface planes in a plane perpendicular to said interface plane.

27. The method of claim 17 wherein said substrate is composed at least in part of a material selected from the group consisting of silicon, germanium, and gallium arsenide.

28. The method of claim 17 wherein said substrate is composed at least in part of material selected from the group consisting of aluminum, titanium, molybdenum, and tungsten.

29. The method of claim 17 wherein said substrate is composed at least in part of material selected from the group consisting of ceramic materials and polyimides.

30. The method of claim 20 wherein said step of establishing conditions in said chamber includes the maintenance of an atmospheric pressure within said chamber in the range between about 0.1 Torr and about 2000 Torr.

31. The method of claim 20 wherein said atmosphere comprises a halogen-containing vapor.

32. The method of claim 1 wherein said etching occurs at a rate between about 100 $\mu$m/sec and about 1000 $\mu$m/sec.

33. The method of claim 17 wherein said etching occurs at a rate between about 100 $\mu$sec and about 1000 $\mu$m/sec.

* * * * *